United States Patent [19]

Tanielian et al.

[11] Patent Number: 4,582,559

[45] Date of Patent: Apr. 15, 1986

[54] METHOD OF MAKING THIN FREE STANDING SINGLE CRYSTAL FILMS

[75] Inventors: Minas Tanielian, Schaumburg; Robert E. Lajos, Crystal Lake; Scott Blackstone, Mount Prospect, all of Ill.

[73] Assignee: Gould Inc., Rolling Meadows, Ill.

[21] Appl. No.: 604,902

[22] Filed: Apr. 27, 1984

[51] Int. Cl.$^4$ ................................................ C30B 1/00
[52] U.S. Cl. ............................ 156/603; 156/DIG. 88
[58] Field of Search ........................... 204/192 S, 298; 156/603, DIG. 88, DIG. 73; 427/91

[56] References Cited

U.S. PATENT DOCUMENTS 3,370,980  2/1968  Anderson .............................. 117/227
4,445,965  5/1984  Milnes .......................... 156/DIG. 88

Primary Examiner—Hiram H. Bernstein
Attorney, Agent, or Firm—Jeannette M. Walder; G. Paul Edgell; Edward E. Sachs

[57] ABSTRACT

Thin free standing single crystal films can be produced by sputter depositing a layer of stressable metal onto a single crystal substrate, treating the composite so produced to effect stressing of the metal layer which then peels away with a portion of the single crystal substrate attached to the metal layer. The free standing film thus produced has typical thickness in the order of tens of micrometers. The metal layer can subsequently be removed by acid etching or other suitable etching techniques, to leave the free standing single crystal film, having a thickness from about 5 microns to about 50 or more.

10 Claims, 7 Drawing Figures

METHOD OF MAKING THIN FREE STANDING SINGLE CRYSTAL FILMS

BACKGROUND OF THE INVENTION

The present invention relates to thin free standing single crystal silicon films, and more particularly to a novel method of making such films.

Free standing single crystal semiconductor films have come to be employed in an enormous number of electronic and related applications, most particularly in the fabrication of electronic devices such as: transistors, sensors and the like.

Presently, semiconductor substrates are sawn from a cylindrical single crystal material (boule) to produce a disk shaped substrate (wafer or slice). Since the sawing action involves a grinding away of the substrate by the saw, an amount of the substrate equal to the width of the saw will be ground away and lost, this loss generally being referred to as "kerf loss".

In producing very thin films it is not unlikely that the kerf loss for each film may be equal to or even greater than the amount of material which ultimately remains in the film. This involves a substantial loss, since the original wafer or substrate represents a very expensive starting material. As a result, the material cost of producing thin films is inordinately high, and in addition, sawing techniques are generally limited to the production of films having a minimum thickness of about several hundred microns.

DRAWINGS

Figure 3:
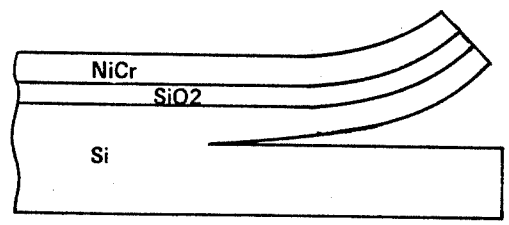
FIG. 3 illustrates an alternative embodiment of FIG. 2.
Figure 4:
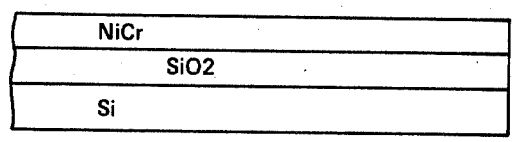
Figure 5:
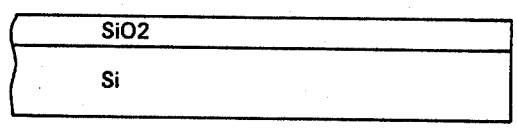
Figure 6:
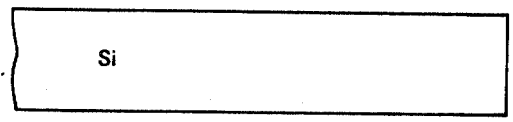

FIGS. 4, 5, and 6 illustrates the films resulting from the embodiment of FIG. 3.

Figure 7:
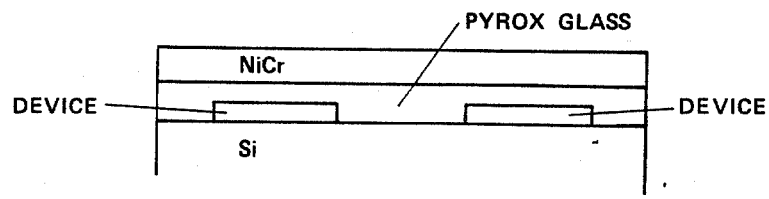

FIG. 7 illustrates a still further embodiment of the present invention.

SUMMARY OF INVENTION

We have now found that thin free standing single crystal films can be produced by sputter depositing a layer of stressable metal onto a single crystal substrate, treating the composite so produced to effect stressing of the metal layer which then peels away with a portion of the single crystal substrate attached to the metal layer. The free standing film thus produced has typical thickness in the order of tens of micrometers. The metal layer can subsequently be removed by acid etching or other suitable etching techniques, to leave the free standing single crystal film, having a thickness from about 5 microns to about 50 or more. Additional layers of metal can be sputter deposited on the remaining surface of the original substrate after a film has been peeled away, to sequentially produce additional thin films with each sputter deposited layer of metal.

It will be understood that the treatment of the composite to effect stressing may merely be permitting the composite to stand until the internal stress within the metal layer begins to effect peeling. The stress necessary for peeling can be further enhanced by subjecting the composite substrate to a thermal shock. The thickness of the film produced by the method of the present invention is a function of the thickness of the sputter deposited metal layer, and in general, as the thickness of the sputter deposited metal layer increases, the thickness of the film peeled away from the original substrate is increased. Films thicker than about 50 microns can of course be produced if desired, though the cost of such fabrication may be prohibitive.

As examples of suitable substrates for use in the practice of the present invention, mention may be made of silicon, with or without a surface layer of silicon dioxide, gallium arsenide, and other single crystal ceramic and/or semiconductor substrates. The present invention has particular advantage in that to all intents and purposes substantially the entire original substrate material will end up as usable film, without kerf loss. In addition, it is now possible to produce films thinner than those which were heretofore practical using existing commercial techniques.

Figure 1:
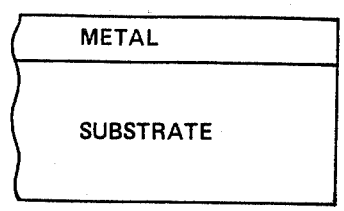
FIG. 1 illustrates a composite comprising a single crystal substrate having a layer of metal sputter deposited thereon.

FIG. 1 illustrates a substrate having deposited thereon a sputter deposited metal layer. The composite illustrated by FIG. 1 would be typical of the composite during or immediately after the sputter depositing of the metal layer.

Figure 2:
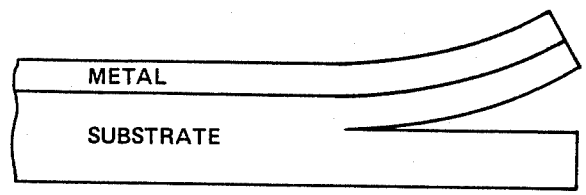
FIG. 2 illustrates the composite of FIG. 1 after tensile stress in the metal layer has caused a film (layer) of substrate to begin peeling.

FIG. 2 illustrates the composite of FIG. 1 after stressing of the metal layer has occured and a film of the single crystal substrate is shown adhering to the metal layer and being pulled away from the remainder of the substrate.

In general, it has been found that a vacuum deposited layer of metal formed by techniques other than sputtering will not provide a continuous film of substrate, such as is obtained when the metal layer is formed by sputtering, because the adhesion between the metal layer and the substrate will not be as good, and stressing will result in peeling of the metal layer from the surface of the substrate without any attached film of substrate. The sputter deposited metal film may be carried out using equipment and techniques well known to those skilled in the art. As a general reference to such equipment and techniques, mention may be made of "Glow Discharge Processes, Sputtering and Plasma Etching" by Brian Chapman (John Wiley & Sons 1980).

PREFERRED EMBODIMENT

In the preferred embodiment of the present invention a layer of nickel/chrome is sputtered on the surface of a substrate selected from the group consisting of gallium arsenide, silicon, and silicon having a thin layer of silicon dioxide on the surface to which the nickel/chrome is sputtered. In addition, a thin protective layer of ceramic or glass may be disposed between the sputtered layer of metal, and the main substrate either to improve adhesive or to protect the substrate surface or devices disposed thereon during subsequent intermediate processing steps. One of the preferred embodiments of the present invention is illustrated in FIG. 3 which is similar to the embodiment of FIG. 2, but involves the use of a nickel/chrome sputtered layer on a silicon substrate having a surface layer of silicon dioxide.

FIG. 4 illustrates the peeled composite of FIG. 3 comprising the sputtered layer of nickel/chrome and the thin film of silicon and silicon dioxide which has peeled away from the main substrate.

FIG. 5 illustrates the film of FIG. 4 after removal of the nickel/chrome layer typically by etching in aqua regia.

FIG. 6 illustrates an alternative embodiment of the film of FIG. 5 in which the silicon dioxide has been removed, typically using buffered hydrofluoric acid.

FIG. 7 illustrates a still further embodiment of the present invention in which one or more typical electronic devices has been fabricated on the surface of the silicon wafer prior to forming the film. In the embodiment illustrated by FIG. 7, after the device has been fabricated, a layer of pyrox (chemical vapor deposited (CVD)-SiO$_2$) glass is deposited over the surface of the silicon substrate, including the devices, and the nickel/chrome layer is then sputtered onto the pyrox glass surface. The embodiment illustrated by FIG. 7 would be particularly useful in a situation where the etchant employed to remove the nickel/chrome layer might also deleteriously effect the electronic devices in the silicon substrate. By employing the embodiment of FIG. 7 it is possible to remove the nickel/chrome layer in aqua regia, and then subsequently remove the pyrox glass layer employing techniques which will not pose a threat to the electronic devices attached to the surface of the silicon film substrate.

The following specific example will serve by way of illustration and not by way of limitation to further describe the novel process of the present invention.

EXAMPLE

Starting with a 2" N-type (100) 10 ohm-cm wafer, a 5000 Å layer of SiO$_2$ was grown by exposing the wafer to steam at 1100° C. for three hours. The wafer was loaded into the system and the system was pumped down to a pressure of less than $5 \times 10^{-7}$ TORR. The nickel/chrome (80% nickel—20% chrome) target was pre-sputtered at a power density of 30 watts/cm$^2$ for 30 minutes after which the shutter was opened and nickel/chrome was sputtered onto the wafer for about 60 minutes. The system was then pumped back down to less than $5 \times 10^{-7}$ TORR. The wafer was allowed to cool for 30 minutes after which the system was back-filled with air and the wafer removed.

It will be understood that any suitable technique may be employed to remove the nickel/chrome layer and/or the silicon dioxide layer. While specific times and reagents will be a function of the technique chosen, typically the nickel/chrome is etched in aqua regia at room temperature for a period sufficient to remove all of the nickel/chrome i.e. 10 to 20 minutes. The silicon dioxide and/or pyrox glass, where present, typically were removed by etching in buffered hydrofluoric acid at room temperature for a period from about 5 minutes to 20 minutes depending upon the thickness of the layer of silicon dioxide or glass. Where thermal shock techniques were employed, the thermal shock was typically induced either by heating or cooling as by employing liquid nitrogen immersion or shock heating to temperatures of about 300° C. The choice of actual temperature for shock heat treatment of a particular composite may be higher or lower depending upon the thickness of the metal layer and the particular substrate to which it has be sputtered. A preferred range of temperature for shock treatment is from about 200 degrees Celsius to about 800 degrees Celsius.

In the course of a series of experiments, it was found that successive layers of film could be removed from the substrate by subsequent sputtering of a new metal layer to the remaining surface of the substrate. It was also found that the degree of uniformity between successive layers of film removed from a particular substrate quite closely corresponded to the uniformity of thickness of the sputtered layer of metal which effected their removal.

Finally the films of the present invention would appear to have particular utility in the fabrication of solar cells in at least two specific respects. Thin films of single crystal silicon are particularly desirable for solar cell applications, and the method of the present invention provides thinner films than have heretofore been available employing commercially viable manufacturing techniques. In addition, the surface of the films produced by the present invention is not perfectly smooth such as would be obtained by polishing techniques. In other words, the surface of the films of the present invention would be more typically described as "rough" rather than perfectly polished smooth, and this may be advantageous in solar cell applications where it would promote light absorption and reduce light reflection.

The processes of the present invention can also be employed in the converse manner to provide "trenches" on the surface of a substrate. In such a procedure, the surface of the substrate could be masked and the metal layer sputtered only on a portion of the surface, whereby after peeling they would leave trenches in the surface of the substrate which could be utilized to secure devices or other similar use.

It will of course also be obvious that still other changes, modifications and alterations can be made in the materials, apparatus and methods herein described without departing from the scope of the invention herein disclosed and it is our intention to be limited only by the appended claims.

As our invention we claim:

1. A method of fabricating thin free standing single crystal films, the steps which comprise:
    sputter depositing a layer of stressable metal onto a single crystal substrate, said metal layer adhering to said substrate;
    treating the composite so produced to effect stressing of the metal layer;
    peeling said metal layer and a thin film of said single crystal substrate attached to said metal layer from said substrate; and
    removing said metal layer from said thin single crystal film.

2. The method according to claim 1 wherein said metal is an 80–20 nickel/chrome alloy.

3. The method according to claim 2 wherein said substrate is a member selected from the group consisting of gallium arsenide, silicon, and silicon having a thin layer of silicon dioxide on the surface to which the nickel/chrome is sputtered.

4. The method according to claim 3 wherein a thin ceramic coating is deposited on the surface of the substrate prior to sputter depositing of said metal layer, and wherein after said metal layer is removed, said ceramic layer is removed.

5. The method according to claim 3 wherein a thin glass coating is deposited on the surface of the substrate prior to sputter depositing of said metal layer, and wherein after said metal layer is removed, said glass layer is removed.

6. The method according to claim 4 wherein at least one electronic device is disposed on said surface of said substrate prior to deposition of said coating of ceramic.

7. The method according to claim 5 wherein at least one electronic device is disposed on said surface of said substrate prior to deposition of said coating of glass.

8. The method according to claim 3 wherein said treatment comprises subjecting said composite to cold shock.

9. The method according to claim 8 wherein said treatment comprises subjecting said composite to cold shock by immersing said composite in liquid nitrogen.

10. The method according to claim 3 wherein said treatment comprises subjecting said composite to heat shock at a temperature of from about 200° C. to about 800° C.

* * * * *